United States Patent
Di Fiore et al.

(10) Patent No.: US 12,151,427 B2
(45) Date of Patent: Nov. 26, 2024

(54) HOUSING STRUCTURE MANUFACTURING METHOD AND ELECTRONIC DEVICE

(71) Applicant: ADATA TECHNOLOGY CO., LTD., New Taipei (TW)

(72) Inventors: Luca Di Fiore, New Taipei (TW); Shih-Huang Tsai, New Taipei (TW); Chih-Chun Huang, Taipei (TW); Hsin-Cheng Hsu, New Taipei (TW)

(73) Assignee: ADATA TECHNOLOGY CO., LTD., New Taipei (TW)

( * ) Notice: Subject to any disclaimer, the term of this patent is extended or adjusted under 35 U.S.C. 154(b) by 511 days.

(21) Appl. No.: 17/420,770

(22) PCT Filed: Jun. 25, 2019

(86) PCT No.: PCT/CN2019/092790
§ 371 (c)(1),
(2) Date: Jul. 6, 2021

(87) PCT Pub. No.: WO2020/258030
PCT Pub. Date: Dec. 30, 2020

(65) Prior Publication Data
US 2022/0118678 A1    Apr. 21, 2022

(51) Int. Cl.
*B29C 61/06*    (2006.01)
*B29C 61/00*    (2006.01)
(Continued)

(52) U.S. Cl.
CPC ............ *B29C 61/06* (2013.01); *B29C 61/003* (2013.01); *B33Y 70/00* (2014.12); *B33Y 80/00* (2014.12); *C09D 5/02* (2013.01); *C09D 177/02* (2013.01); *G06F 3/03543* (2013.01); *H05K 5/00* (2013.01); *B29K 2077/00* (2013.01); *B29K 2105/0061* (2013.01); *B29L 2031/3481* (2013.01)

(58) Field of Classification Search
CPC .... C08J 3/09; C08J 3/00; B29C 61/06; B29C 61/003; B33Y 70/00; B33Y 10/00; B33Y 80/00; H05K 5/00; C09D 177/02; C09D 5/02; G03B 21/00; C08L 77/02; C08L 101/14; G06F 3/03543; B29K 2105/0061; B29K 2077/00; B29L 2031/3481
See application file for complete search history.

(56) References Cited

U.S. PATENT DOCUMENTS 5,662,362 A    9/1997    Kapgan et al.
6,016,138 A    1/2000    Harskamp et al.
(Continued)

FOREIGN PATENT DOCUMENTS

CN    201110997 Y    9/2008
CN    102411770 A    4/2012
(Continued)

*Primary Examiner* — Monica A Huson
(74) *Attorney, Agent, or Firm* — Li & Cai Intellectual Property (USA) Office

(57) ABSTRACT

A housing structure manufacturing method and an electronic device are provided. The housing structure manufacturing method includes providing a plurality of memory polymeric materials, heating the plurality of memory polymeric materials, and forming the housing structure having a first morphology by printing the plurality of memory polymeric materials that are heated.

10 Claims, 5 Drawing Sheets

(51) Int. Cl.
*B33Y 70/00* (2020.01)
*B33Y 80/00* (2015.01)
*C09D 5/02* (2006.01)
*C09D 177/02* (2006.01)
*G06F 3/0354* (2013.01)
*H05K 5/00* (2006.01)
*B29K 77/00* (2006.01)
*B29K 105/00* (2006.01)
*B29L 31/34* (2006.01)

(56) References Cited

U.S. PATENT DOCUMENTS 9,971,427 B2 * 5/2018 Theytaz ................. G06F 3/016
2016/0221308 A1    8/2016 Feinstein
2016/0334865 A1 * 11/2016 Siegfried ................ G06F 3/01

FOREIGN PATENT DOCUMENTS

| CN | 102954338 A | 3/2013 |
| CN | 103841808 A | 6/2014 |
| TW | 201513996 A | 4/2015 |

* cited by examiner

HOUSING STRUCTURE MANUFACTURING METHOD AND ELECTRONIC DEVICE

FIELD OF THE DISCLOSURE

The present disclosure relates to a technical field of 4D printing, and more particularly to a housing structure manufacturing method and an electronic device using 4D printing.

BACKGROUND OF THE DISCLOSURE

Four-dimensional (4D) printing refers to the addition of the dimension of time to three-dimensional (3D) printing, which becomes a 4D technology. In fact, 4D printing is a 3D printing technology that uses materials that can automatically transform over time. 4D printing technology has the opportunity to revolutionize the fields of software, robotics, art, and even space exploration.

SUMMARY OF THE DISCLOSURE

The present disclosure provides a housing structure manufacturing method and an electronic device.

In one aspect, the present disclosure provides a housing structure manufacturing method, which includes providing a plurality of memory polymeric materials, heating the plurality of memory polymeric materials, and forming the housing structure having a first morphology by printing the plurality of memory polymeric materials that are heated.

In certain embodiments, the housing structure manufacturing method further includes changing the housing structure from having the first morphology to having a second morphology by heating the housing structure having the first morphology.

In certain embodiments, the heating includes heating the housing structure by hand.

In certain embodiments, the housing structure manufacturing method further includes changing the housing structure from having the second morphology to having the first morphology by cooling the housing structure having the second morphology.

In certain embodiments, the cooling includes cooling the housing structure by letting the housing structure rest.

In certain embodiments, the plurality of memory polymeric materials include polyamide 12 and hydrogel.

In another aspect, the present disclosure provides an electronic device, which includes a main body structure, a housing structure produced according to the abovementioned housing structure manufacturing method, a roller module, and a processing module. The housing structure is detachably connected to the main body structure, and an accommodating space is defined by the housing structure and the main body structure. The roller module is movably disposed in the housing structure. The processing module is disposed in the accommodating space and is electrically connected to an external device.

In certain embodiments, the housing structure is changed from having a first morphology to having a second morphology by heating.

In certain embodiments, the housing structure is changed from having the second morphology to having the first morphology by cooling.

In certain embodiments, the housing structure includes a plurality of memory polymeric materials, and the plurality of memory polymeric materials include polyamide 12 and hydrogel.

Therefore, one of the beneficial effects of the present disclosure is that structure properties of the housing structure produced according to the housing structure manufacturing method of the present disclosure can be improved by virtue of "providing the plurality of memory polymeric materials", "heating the plurality of memory polymeric materials", and "forming the housing structure having the first morphology by printing the plurality of memory polymeric materials that are heated".

Another beneficial effects of the present disclosure is that structure properties of the electronic device provided by the present disclosure can be improved by virtue of "the electronic device including the main body structure, the housing structure produced according to the abovementioned housing structure manufacturing method, the roller module, and the processing module", "the housing structure having the first morphology, the housing structure being detachably connected to the main body structure, and the accommodating space being defined by the housing structure and the main body structure", "the roller module being movably disposed in the housing structure", and "the processing module being disposed in the accommodating space, and being electrically connected to the external device".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
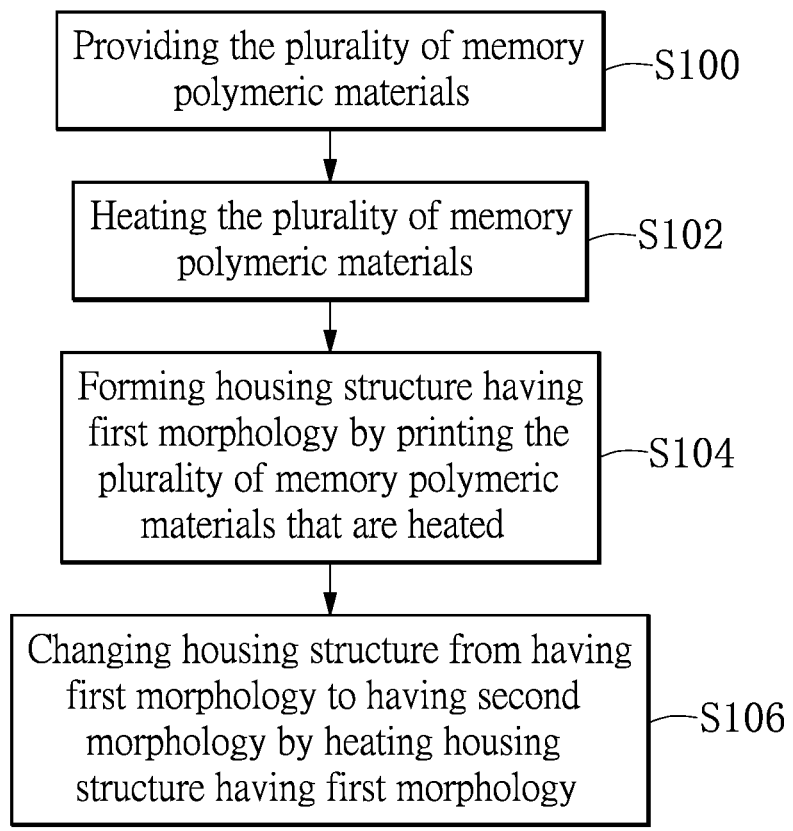
FIG. 1 is a flowchart of a housing structure manufacturing method according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 3:
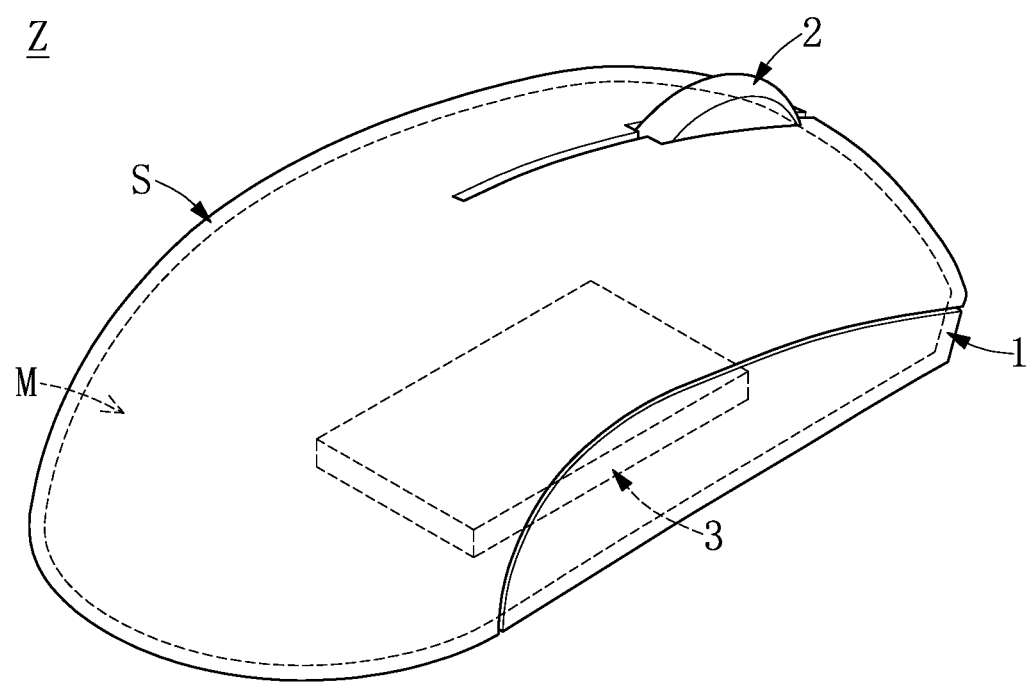
FIG. 3 is a schematic view of a first structure of an electronic device according to a third embodiment of the present disclosure.

Referring to FIG. 1, FIG. 1 is a flowchart of a housing structure manufacturing method according to a first embodiment of the present disclosure. As shown in the figure, the first embodiment of the present disclosure provides a housing structure manufacturing method, and the housing structure manufacturing method includes the following steps.
  (a) Providing a plurality of memory polymeric materials (step S100). For example, the memory polymeric materials includes polyamide 12 (PA12) and hydrogel. Polyamide 12 can be a shape memory polymer.
  (b) Heating the plurality of memory polymeric materials (step S102). For example, polyamide 12 and hydrogel are mixed and then heated to be fully mixed, in which a heating temperature is between 150° C. and 180° C., and a heating time is 12 hours.
  (c) Forming a housing structure having a first morphology by printing the plurality of memory polymeric materials that are heated (step S104). For example, the mixed polyamide 12 and hydrogel are printed by a 3D printing device to form a housing structure S. The housing structure S has the first morphology (as shown in FIG. 3), that is, an undeformed state. The housing structure S can be applied to any technical field of electronic devices, such as mice, mobile phones, tablets, keyboards, earphones, etc. In the present disclosure, the mouse is used as an example, but it is not limited thereto.

Figure 4:
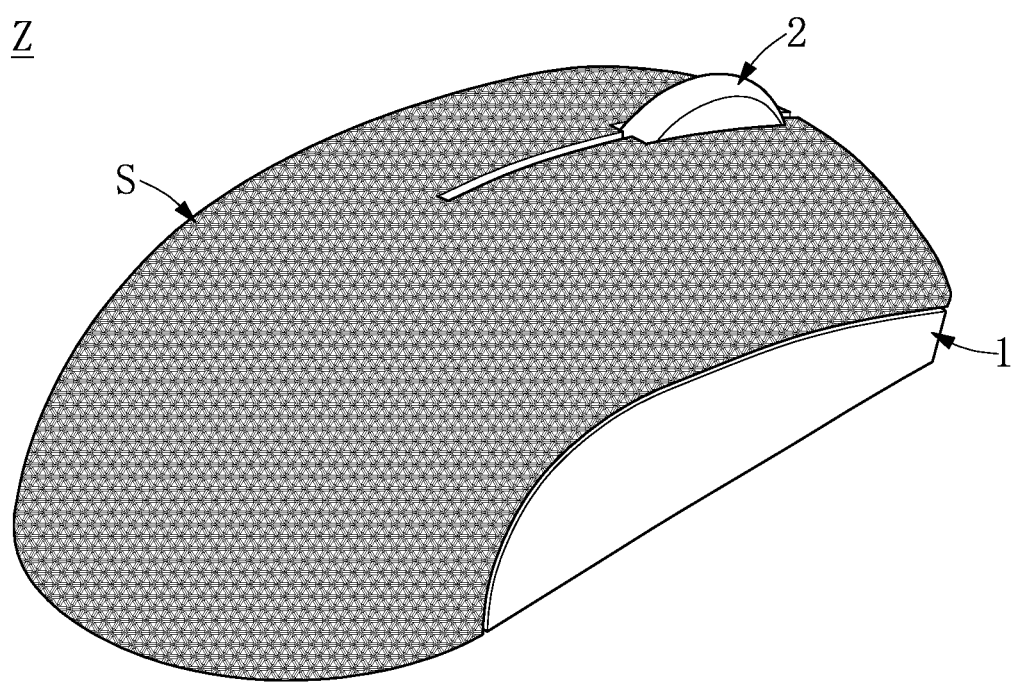
FIG. 4 is a schematic view of a second structure of the electronic device according to the third embodiment of the present disclosure.

Furthermore, the housing structure manufacturing method according to the present disclosure includes the following step.
  (d) Changing the housing structure S from having the first morphology to having a second morphology by heating the housing structure S having the first morphology (step S106). For example, when a user heats the housing structure S by a heating means, that is, by hand, lamp, light, etc., the housing structure S is changed from having the first morphology (i.e., the undeformed state) to having the second morphology (i.e., a deformed state, as shown in FIG. 4). In the present step, the heating temperature is between 30° C. and 35° C.

As mentioned above, the heating means can include heating the housing structure by hand, lamp or light, but it is not limited thereto.

However, the aforementioned description for the housing structure manufacturing method of the first embodiment is merely an example and is not meant to limit the scope of the present disclosure.

Second Embodiment

Figure 2:
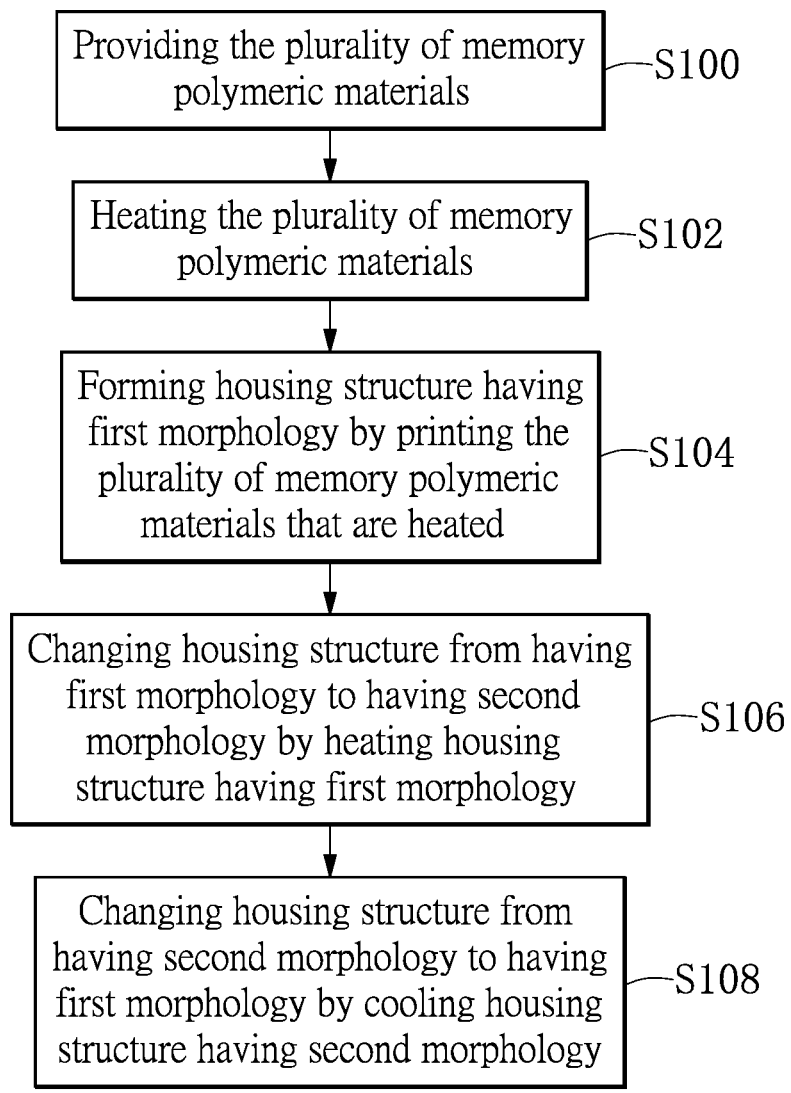
FIG. 2 is a flowchart of the housing structure manufacturing method according to a second embodiment of the present disclosure.

Referring to FIG. 2, which is to be read in conjunction with FIG. 1, FIG. 2 is a flowchart of a housing structure manufacturing method according to a second embodiment of the present disclosure. As shown in the figure, the housing structure manufacturing method according to the present disclosure further includes the following step.
  (f) Changing the housing structure S from having the second morphology to having the first morphology by cooling the housing structure S having the second morphology (step S108). For example, when the user cools the housing structure S, that is, the housing structure S is allowed to stand until the housing structure S is cooled down to a temperature below 30° C., the housing structure S is changed from having the second morphology (i.e., the deformed state, as shown in FIG. 4) to having the first morphology (i.e., the undeformed state, as shown in FIG. 3).

As mentioned above, the cooling means includes allowing the housing structure S to stand or other cooling manners to cool the housing structure S.

However, the aforementioned description for the housing structure manufacturing method of the second embodiment is merely an example and is not meant to limit the scope of the present disclosure.

Third Embodiment

Figure 5:
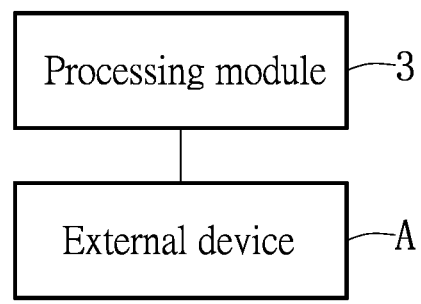
FIG. 5 is a functional block view of the electronic device according to the third embodiment of the present disclosure.

Referring to FIG. 3 to FIG. 5, which is to be read in conjunction with FIG. 1 and FIG. 2, FIG. 3 to FIG. 5 are respectively a schematic view of a first structure of an electronic device, a schematic view of a second structure of the electronic device, and a functional block view of the electronic device according to a third embodiment of the present disclosure. As shown in the figures, the third embodiment of the present disclosure provides an electronic device Z, which includes a main body structure 1, the housing structure S produced according to the abovementioned housing structure manufacturing method, a roller module 2, and a processing module 3. The housing structure S has a first morphology. The housing structure S is detachably connected to the main body structure 1, and an accommodating space M is defined by the housing structure S and the main body structure 1. The roller module 2 is movably disposed in the housing structure S. The processing module 3 is disposed in the accommodating space M, and can be electrically connected to an external device A.

Specifically speaking, the electronic device Z provided by the third embodiment of the present disclosure includes the main body structure 1, the housing structure S, the roller module 2, and the processing module 3. The housing structure S is produced according to the abovementioned housing structure manufacturing method, and has the first morphology (i.e., an undeformed state, as shown in FIG. 3). The housing structure S includes a plurality of memory polymeric materials. The plurality of memory polymeric materials include polyamide 12 and hydrogel, but it is not limited thereto. The main body structure 1 can be a lower cover housing structure, and the housing structure S can be an upper cover housing structure. The housing structure S is detachably connected to the main body structure 1, and the accommodating space M for accommodating the processing module 3 is defined by the housing structure S and the main body structure 1. The processing module 3 can include a circuit board, a processor, and a sensor, and can be electrically connected to the external device A. The roller module 2 is movably disposed in the housing structure S, and is movably connected to the processing module 3.

Furthermore, the electronic device Z provided by the present disclosure can be a mouse device. The user can control the external device A (e.g., a computer) through the electronic device Z. The processing module 3 can generate a corresponding signal according to a movement of the electronic device Z or a rolling movement of the roller module 2, and transmit the corresponding signal to the external device A.

In addition, when the user heats the housing structure S by hand, lamp, light, etc., the housing structure S is changed from having the first morphology (i.e., an undeformed state) to having a second morphology (i.e., a deformed state). When the housing structure S has the second morphology, a surface of the housing structure S is in a specific mesh-like structure (as shown in FIG. 4). Accordingly, an area of a palm of the user in contact with housing structure S can be reduced through the specific structure created by the housing structure S having the second morphology, such that a heat dissipation effect can be achieved.

Conversely, when the user cools the housing structure S by letting the housing structure S rest or other cooling manners, the housing structure S is changed from having the second morphology to having the first morphology. When the housing structure S has the first morphology, the surface of the housing structure S is smooth (as shown in FIG. 3).

However, the aforementioned description for the housing structure manufacturing method of the third embodiment is merely an example and is not meant to limit the scope of the present disclosure thereto.

Beneficial Effects of the Embodiments

In conclusion, one of the beneficial effects of the present disclosure is that structure properties of the housing structure S produced according to the housing structure manufacturing method of the present disclosure can be improved by virtue of "providing the plurality of memory polymeric materials", "heating the plurality of memory polymeric materials", and "forming the housing structure S having the first morphology by printing the plurality of memory polymeric materials that are heated".

Another beneficial effects of the present disclosure is that structure properties of the electronic device Z provided by the present disclosure can be improved by virtue of "the electronic device Z including the main body structure 1, the housing structure S produced according to the abovementioned housing structure manufacturing method, the roller module 2, and the processing module 3", "the housing structure S having the first morphology, the housing structure S being detachably connected to the main body structure 1, and the accommodating space M being defined by the housing structure S and the main body structure 1", "the roller module 2 being movably disposed in the housing structure S", and "the processing module 3 being disposed in the accommodating space M, and being electrically connected to the external device A".

Furthermore, through the abovementioned technical solution, the housing structure S that can automatically transform shapes of structures over time and according to external factors is provided. In addition, the electronic device Z with the housing structure S is lighter in weight and has a function of changing the shape, and can be contracted and expanded, such that structure properties of the electronic device Z can be improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A manufacturing method, comprising:
   providing a mixture of memory polymeric materials;
   performing a heating process on the mixture of memory polymeric materials and feeding the mixture of memory polymeric materials to a 3D printing device; and
   forming a housing structure having a first morphology from the mixture of memory polymeric materials by performing 3D printing,
   wherein the mixture of memory polymeric materials includes polyamide 12 and hydrogel.

2. The method according to claim 1, further comprising:
   raising a temperature of the housing structure in the first morphology, so as to change the housing structure into the second morphology from the first morphology.

3. The method according to claim 2, wherein the heating includes
   heating the housing structure by hand.

4. The method according to claim 2, further comprising:
   changing the housing structure from having the second morphology to having the first morphology by cooling the housing structure having the second morphology.

5. The method according to claim 4, wherein the cooling includes
   cooling the housing structure by letting the housing structure rest.

6. An electronic device, comprising:
   a main body structure;
   a housing structure produced in accordance with the manufacturing method of claim 1, the housing structure having a first morphology,
      the housing structure being detachably connected to the main body structure, and an accommodating space being defined by the housing structure and the main body structure;
   a roller module movably disposed in the housing structure; and
   a processing module disposed in the accommodating space and being electrically connected to an external device,
      wherein the housing structure includes a mixture of memory polymeric materials, and the mixture of memory polymeric materials includes polyamide 12 and hydrogel.

7. The electronic device according to claim 6, when a temperature of the housing structure is increased, the housing structure changes into the second morphology from the first morphology.

8. The electronic device according to claim 7, wherein the housing structure is changed from having the second morphology to having the first morphology by cooling.

9. The method of claim 2, wherein changing the housing structure to having a second morphology comprising heating the housing structure having the first morphology to create a mesh-like structure on a surface of the housing structure.

10. A manufacturing method, comprising:
   providing a mixture of memory polymeric materials;
   performing a heating process on the mixture of memory polymeric materials and feeding the mixture of memory polymeric materials to a 3D printing device; and
   forming a housing structure having a first morphology from the mixture of memory polymeric materials by performing 3D printing,
   wherein the mixture of memory polymeric materials includes polyamide 12 and hydrogel,
   wherein the providing a mixture of memory polymeric materials comprises mixing and heating polyamide 12 and hydrogel with a heating temperature between 150° C. and 180° C. for a time period of 12 hours.

* * * * *